(12) United States Patent
Dante

(10) Patent No.: US 6,844,757 B2
(45) Date of Patent: Jan. 18, 2005

(54) CONVERTING BITS TO VECTORS IN A PROGRAMMABLE LOGIC DEVICE

(75) Inventor: Conrad Dante, Portland, OR (US)

(73) Assignee: Lattice Semiconductor Corp., Hillsboro, OR (US)

(*) Notice: Subject to any disclaimer, the term of this patent is extended or adjusted under 35 U.S.C. 154(b) by 141 days.

(21) Appl. No.: 10/187,236

(22) Filed: Jun. 28, 2002

(65) Prior Publication Data

US 2004/0000927 A1 Jan. 1, 2004

(51) Int. Cl.$^7$ ............................................. H03K 19/173
(52) U.S. Cl. ............................. 326/41; 326/38; 326/39
(58) Field of Search ..................................... 326/38–41

(56) References Cited

U.S. PATENT DOCUMENTS

| | | |
|---|---|---|
| 4,642,487 A | 2/1987 | Carter |
| 4,706,216 A | 11/1987 | Carter |
| 4,758,985 A | 7/1988 | Carter |
| 5,197,065 A | 3/1993 | Calvignac et al. |
| 5,295,137 A | 3/1994 | Jurkevich |
| 5,754,459 A | 5/1998 | Telikepalli |
| 6,023,742 A | 2/2000 | Ebeling et al. |
| 6,262,908 B1 | 7/2001 | Marshall et al. |
| 6,275,491 B1 | 8/2001 | Prasad et al. |
| 6,289,097 B1 | 9/2001 | Gregory et al. |
| 6,362,650 B1 | 3/2002 | New et al. |
| 6,363,319 B1 | 3/2002 | Hsu |
| 6,538,470 B1 * | 3/2003 | Langhammer et al. ........ 326/41 |
| 2002/0089348 A1 * | 7/2002 | Langhammer |

OTHER PUBLICATIONS

Chameleon Systems—Your Communication Platform; from website www. chameleonsystems.com, 5 pages.

"Tool suite supports reconfigurable processor" article by Richard Goering; published in *EE Times* on Aug. 14, 2001, 6 pages.

Xilinx Home; Virtex–II Pro Platform FPGAs; The Platform for Programmable Systems; from website www.xilinx.com, 3 pages.

Xilinx Home; PowerPC Embedded Processor Solution; from website www.xilinx.com, 2 pages.

Xilinx Home; The First Platform FPGA Solution; from website www.xilinx.com, 2 pages.

(List continued on next page.)

*Primary Examiner*—Anh Q. Tran

(57) ABSTRACT

A circuit is disclosed for a programmable logic device (PLD) environment that converts unordered bits in a PLD domain to fixed-width vectors in a vector domain. The fixed-width vectors may be used within a vector processing block (VPB) that operates on data in vector format. The PLD includes multiple programmable logic blocks that are configurable by a user. The logic blocks operate on data at a bit level resulting in unordered bits of information in a PLD domain. However, a vector processing block operates on data on a vector level (e.g., 8 bits, 16 bits, 32 bits, 64 bits, etc.). Thus, an interface is coupled between the programmable logic blocks and the vector processing block that converts at least a portion of the unordered bits of information from the PLD domain to one or more fixed-width vectors for use in the vector processing block. The interface may also perform scaling and/or sign extension on the unordered bits, to further free up expensive resources in the PLD domain.

32 Claims, 5 Drawing Sheets

OTHER PUBLICATIONS

Xilinx Home; Virtex–II Platform FPGA Features; from website www.xilinx.com, 3 pages.

QuickLogic Home; QuickRAM, Dual–Port Embedded RAM for Extremely High Performance Functions; from website www.quicklogic.com, 3 pages.

QuickLogic Home; QuickDSP, Embedded DSP Building Blocks for High Performance, Complex DSP Designs; from website www.quicklogic.com, 2 pages.

QuickLogic Home; Eclipse, High Performance FPGAs with Enhanced Logic Supercell; from website www.quicklogic.com, 3 pages.

"Re–configurable High Speed Arithmetic Functions in a Non–Volatile FPGA", written by Rufino T. Olay III, Customer Engineer at QuickLogic, 6 pages, no date.

High Performance Multipliers in QuickLogic FPGAs, written by John Birkner, Jim Jian and Kevin Smith of QuickLogic, 9 pages, no date.

J.C. Alves et al., "RVC—A Reconfigurable Coprocessor for Vector Processing Applications", IEEE Com. Soc., pp. 258–259 (1998).

"Stratix: Programmable Logic Device Family," Altera Corporation, Aug. 2002, Ver. 2.1 Data Sheet.

"Silicon," Xilinx Products website, http://www.xilinx.com/xlnx/xil_prodcat_product.jsp?title+silicon, printed Sep. 16, 2002, 3 pages.

* cited by examiner

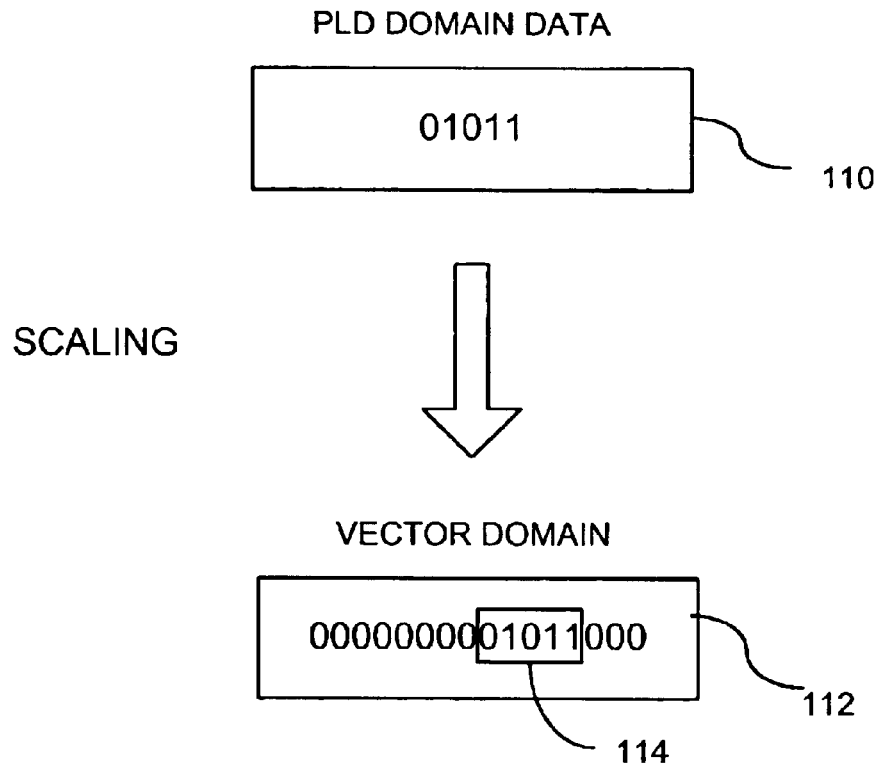
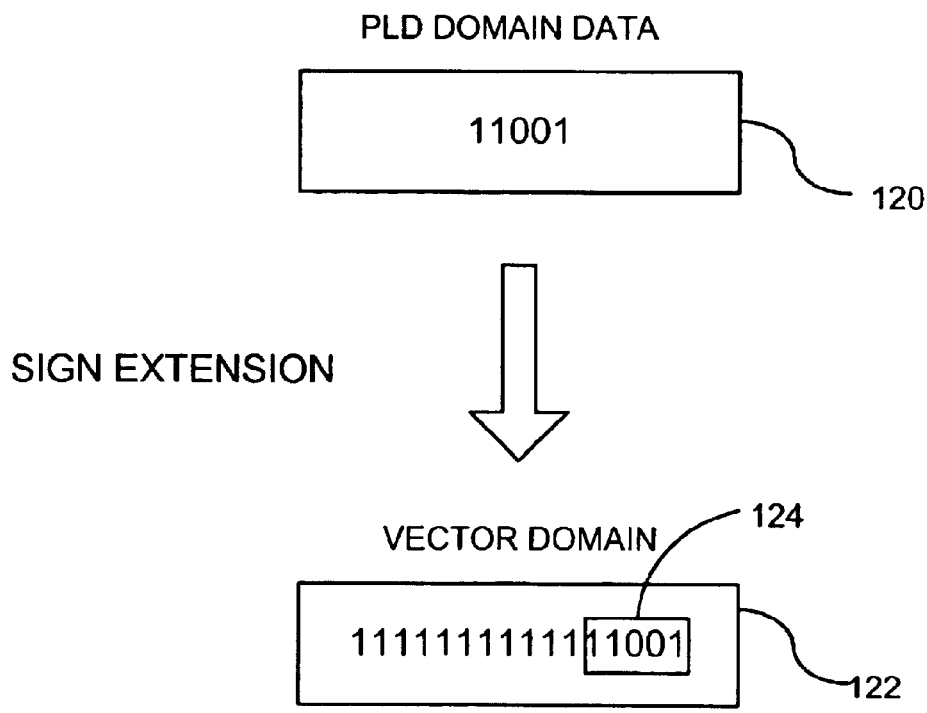

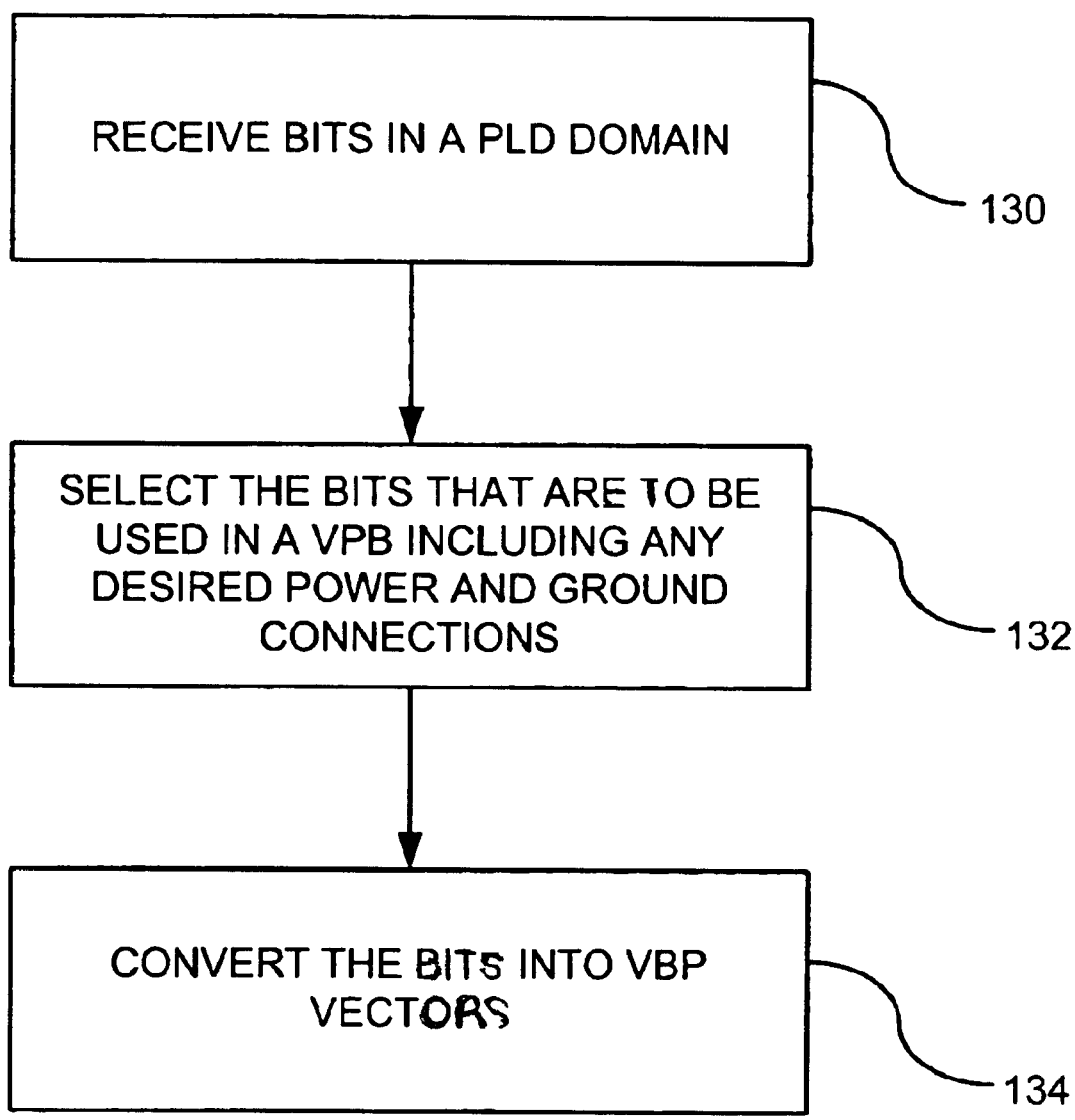

US 6,844,757 B2

CONVERTING BITS TO VECTORS IN A PROGRAMMABLE LOGIC DEVICE

TECHNICAL FIELD

The present invention relates to programmable logic devices (PLDs) such as field programmable gate arrays (FPGAs) and CPLDs. More particularly, the present invention relates to an interface for ordering and formatting data bits within a PLD.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured or programmed (the terms are used interchangeably in the art) into a virtually unlimited number of specific logic functions. PLDs provide system designers with the ability to quickly create custom logic functions to provide product differentiation without sacrificing rapid time to market. PLDs may be reprogrammable, meaning that the logic configuration can be reconfigured after the initial programming.

A type of PLD is called a Field-Programmable Gate Array (FPGA). An FPGA is a general-purpose device that can be programmed by an end user to perform one or more selected functions. An FPGA typically includes an array of individually configurable logic blocks (CLBs), each of which is programmably interconnected to other CLBs and to input/output (I/O) pins via a programmable routing structure to provide the selected function. Examples of such devices are exemplified in U.S. Pat. Nos. 4,642,487; 4,706,216; and 4,758,985.

An FPGA device can be characterized as an integrated circuit that may include four major features:

(1) A user-accessible, configurable memory device, such as SRAM, EPROM, EEPROM, anti-fused, fused, or other, is provided in the FPGA device so as to be at least once-programmable by device users for defining user-provided configuration instructions. Static Random Access Memory or SRAM is a form of reprogrammable memory that may be differently programmed many times. Electrically Erasable and reprogrammable ROM or EEPROM is an another example of nonvolatile reprogrammable memory. The configurable memory of an FPGA device may be formed of mixture of different kinds of memory elements if desired (e.g., SRAM and EEPROM).

(2) Input/Output Blocks (IOBs) are provided for interconnecting other internal circuit components of the FPGA device with external circuitry. The IOBs may have fixed configurations or they may be configurable in accordance with user-provided configuration instructions.

(3) CLBs are provided for carrying out user-programmed logic functions (e.g., logic gates) as defined by user-provided configuration instructions. Typically, each of the many CLBs of an FPGA has at least one lookup table (LUT) that is user-configurable to define any desired truth table. A CLB may have other resources such as LUT input signal pre-processing resources and LUT output signal post-processing resources. Although the term "CLB" was adopted by early pioneers of FPGA technology, it is not uncommon to see other names being given to the repeated portion of the FPGA that carries out user-programmed logic functions. An example of another name often associated with a repeated portion of an FPGA is a Generic Logic Block (GLB).

(4) An interconnect network is provided for carrying signal traffic within the FPGA device between various CLBs and/or between various IOBs and/or between various IOBs and CLBs. At least part of the interconnect network is typically configurable so as to allow for programmably-defined routing of signals between various CLBs and/or IOBs in accordance with user-defined routing instructions.

Most FPGAs have these four features, but modem FPGAs tend to be even more complex. For example, many CLBs can be configured together to implement such devices as multipliers or complex microprocessors. For example, U.S. Pat. No. 5,754,459, issued May 19, 1998 to Telikepalli, teaches implementing a multiplier circuit using a number of CLBs in an FPGA architecture. However, implementing a multiplier using CLBs of an FPGA architecture may not only consume valuable CLB resources, but also consume valuable general interconnect resources, which in turn may slow performance of the FPGA device. Consequently, preconfigured, dedicated multipliers have been inserted into some FPGA designs in order to free valuable CLB resources for other functions, such as illustrated in U.S. Pat. No. 6,362,650 to New, et al.

Nonetheless, it is desirable to provide an FPGA device that can further free CLB resources while increasing overall functionality. However, including other dedicated components into an FPGA creates routing problems that heretofore have not been addressed.

SUMMARY

A PLD is disclosed that uses vector components (e.g., vector processing blocks) as a dedicated PLD resource. Vector components require input information to be provided in vectors (e.g., 8 bits, 16 bits, 32 bits, 64 bits, etc.). However, logic blocks in the PLD traditionally manipulate information as unordered bits. Thus, routing between PLD logic blocks to vector components places a significantly larger burden on PLD routing resources than would otherwise be required to route information between PLD logic blocks. Consequently, an interface is disclosed that converts unordered bits in a PLD domain to vectors in a vector domain. The interface may also perform formatting functions, such as scaling and/or sign extension, on the unordered bits to further free up expensive resources in the PLD domain.

These and other aspects will become apparent from the following detailed description, which makes references to the accompanying drawings.

BRIEF DESCRIPTION OF THE DRAWINGS

FIG. 6 shows a scaling operation that may be performed using the interface of FIG. 4.

FIG. 7 shows a sign-extension function that may be performed using the interface of FIG. 4.

FIG. 8 shows a flowchart of a method for converting bits from the PLD domain to the vector domain.

DETAILED DESCRIPTION

Figure 1:
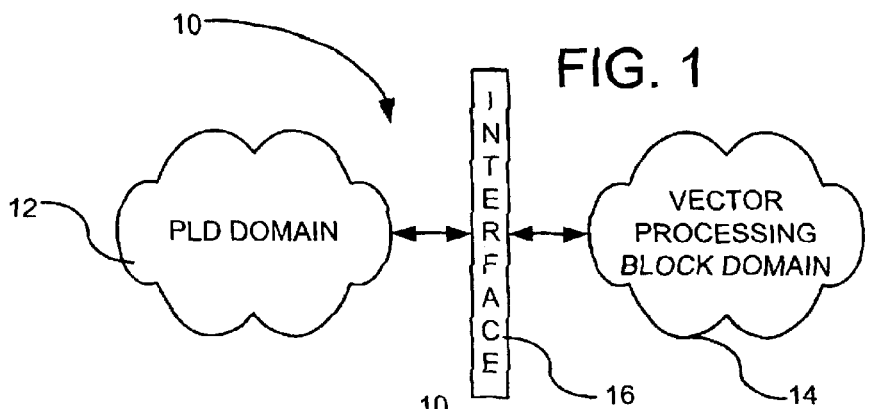
FIG. 1 shows a high-level diagram of an interface within a PLD for converting bits from a PLD domain to vectors in a vector domain.

FIG. 1 shows a high-level diagram of a PLD 10 in accordance with the invention including a PLD domain 12, a vector domain 14, and an interface 16 between the two domains 12 and 14. The PLD may be one of many types of programmable devices, such as a field programmable gate array (FPGA). The PLD domain may include conventional fine-grain logic, memory and routing resources where signals are switched and routed on a bit-by-bit basis. Such bit-by-bit manipulation is termed unordered because the bits are not arranged in a predetermined order throughout the domain. The vector domain 14 may include course-grain logic blocks (also referred to herein as vector processing blocks, or VPBs) that perform functions on digital words (integer operands) that include multiple bits grouped together (e.g., 16, 32, 64 bits, etc) in a predetermined order throughout the domain. These words of ordered bits are referred to as vectors. In the vector domain 14, groups of wires are routed together as a vector signal path so that all bits in a digital word are manipulated as a vector. That is, the bits in a vector are controlled and switched at once as a group. The interface 16 converts selected unordered bits from the PLD domain 12 to vectors for the vector domain. As further described below, the interface 16 may also perform other functions, such as the formatting functions of scaling and sign extension, to further remove any routing burdens on the PLD domain.

Figure 2:
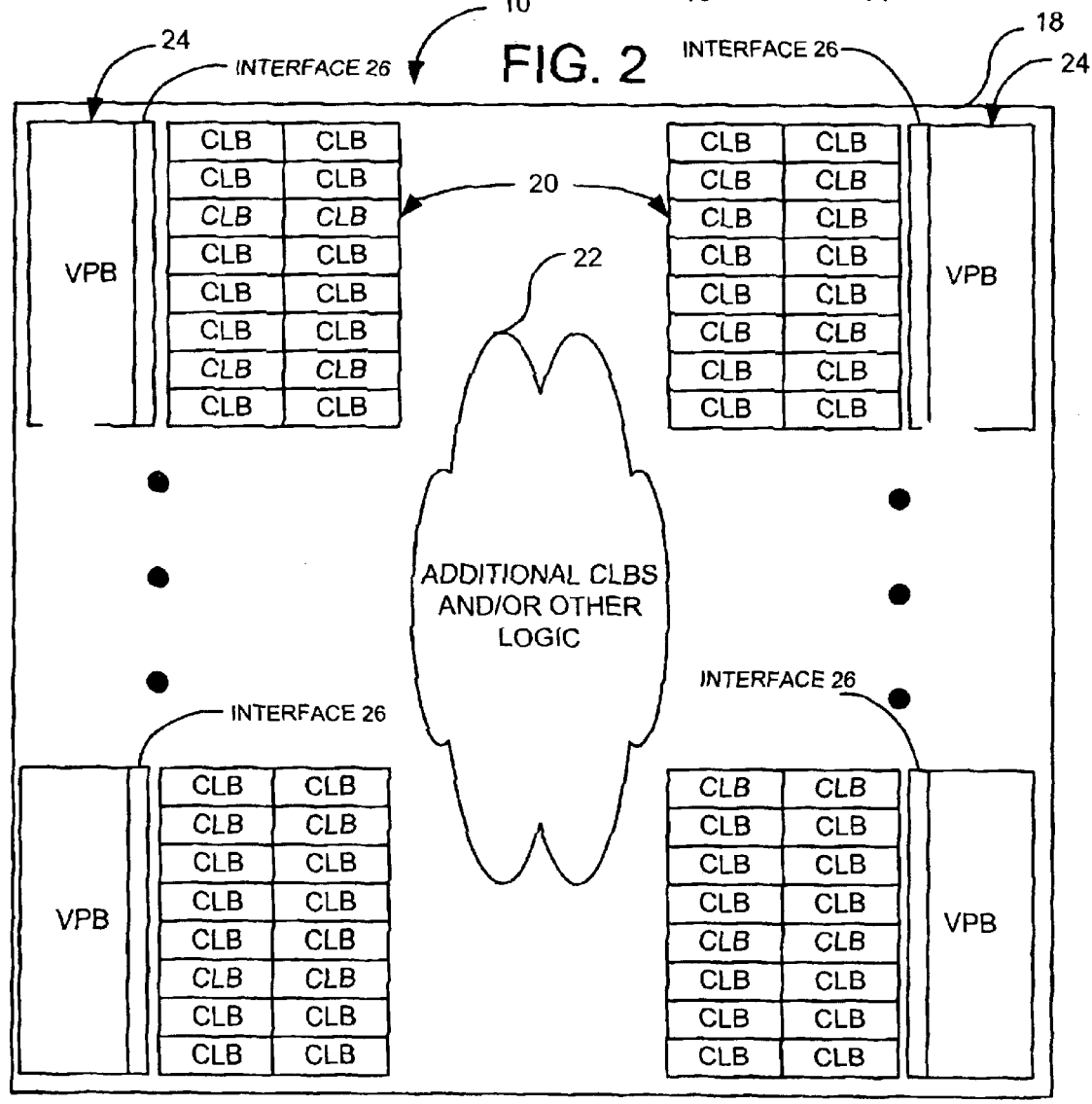
FIG. 2 is a block diagram showing a PLD having multiple vector processing blocks (VPBs) with multiple interfaces for communicating between vector and PLD domains.

FIG. 2 shows a block diagram of the PLD 10 in greater detail. The PLD is housed in an outer package 18, which includes input and output pins (not shown). The PLD has multiple columns of configurable logic blocks (CLB), as shown generally at 20. The number of columns of CLBs varies based on the design. As shown at 22, additional CLBs and/or other logic may also exist within the PLD. For example, other devices (e.g., memories, multipliers, etc.) may be included in logic 22. The illustrated PLD 10 includes one or more columns of VPBs, shown generally at 24. Within each VPB is an interface 26 (a particular implementation of interface 16) to facilitate communication with the adjacent CLBs. In the illustrated design there is one interface per VPB, although additional interfaces may be included. Alternatively, the interface 26 may be located externally to VPB 24.

Figure 3:
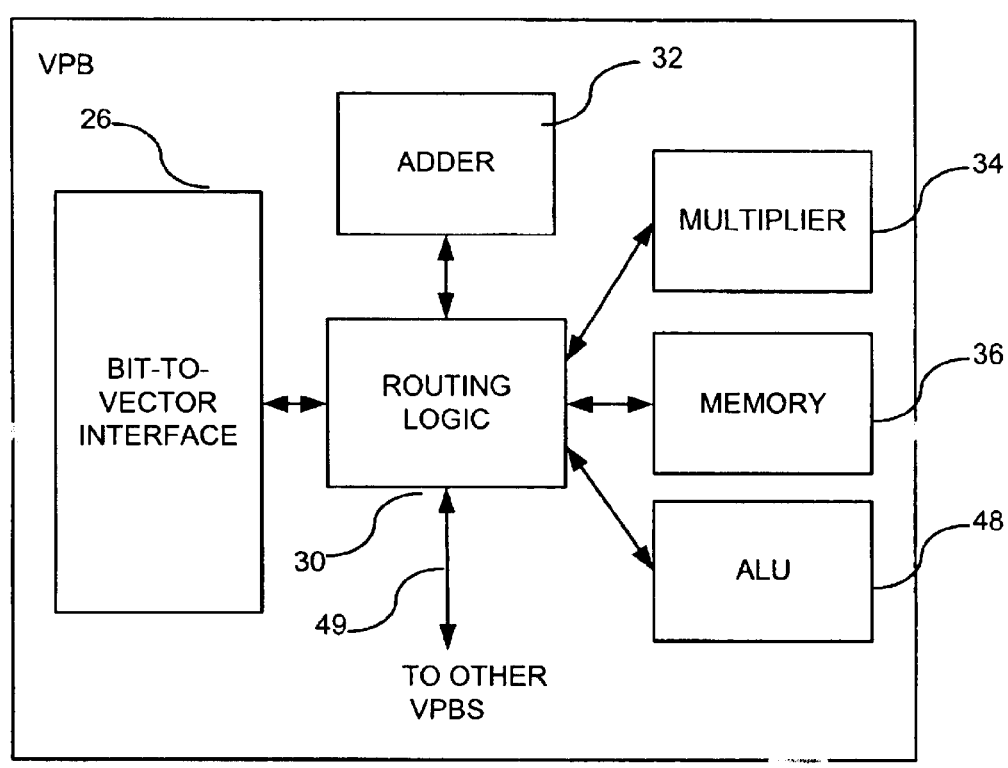
FIG. 3 is a high-level block diagram of an exemplary VPB of FIG. 2.

FIG. 3 shows a more detailed diagram of a VPB 24. Routing logic 30 is coupled to the interface 26 and facilitates routing to various components (i.e., engines) within the VPB. For example, the VPB may include one or more of the following engines: adders (e.g., adder 32), multipliers (e.g., multiplier 34), memory (e.g., memory 36) and ALUs (e.g., ALU 48). As shown at 49, the VPB 24 may be connected via the routing logic 30 to engines within other VPBs in the PLD 10. Thus, the vectors can be routed between VPBs. Other features of the VPB are not shown but may be readily included, such as VPB engines (i.e. specialized pipelined datapath units that perform functions with vector data, which would be especially expensive or difficult to accomplish with PLD cells). Preferably, the VPB is not a general-purpose processor. In the illustrated embodiment it is an application-specific embedded processor that requires a relatively small program store and only communicates with dedicated internal resources. The embedded processor is not built from combinations of programmable logic blocks. Instead, it is made from logic that is designed for a particular type of function (e.g., multiply, add, etc.). By contrast, general processors require large program stores and flexible interfaces to support a wide range of peripheral devices, such as keyboards, disk drives, printers and scanners.

Figure 4:
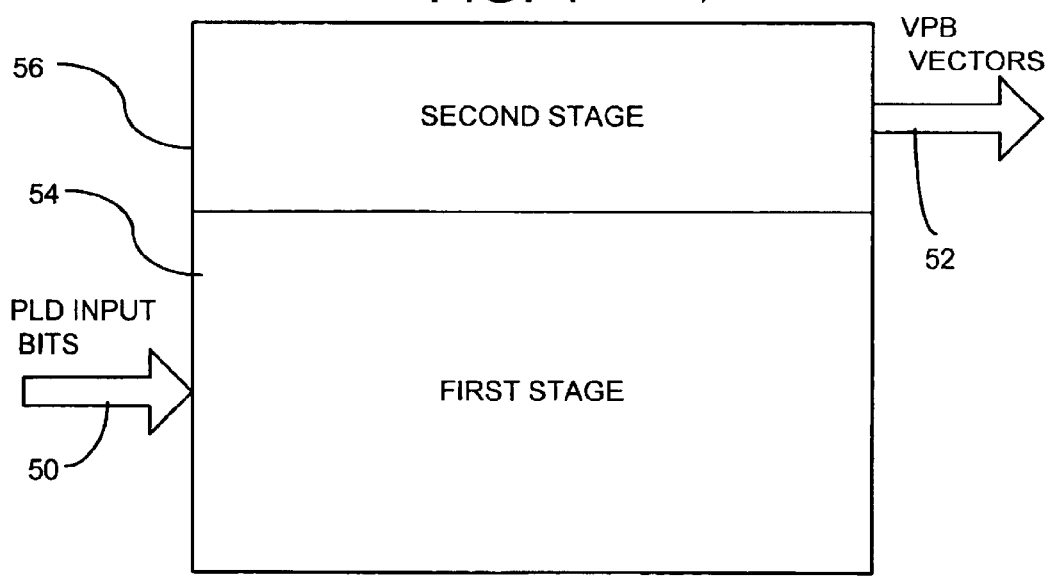
FIG. 4 is a high-level diagram of an interface of FIG. 2.

FIG. 4 is a high-level block diagram of the bit-to-vector interface 26. Interface 26 includes an input port 50 for receiving the PLD input bits, an output port 52 for supplying output vectors, and two stages 54, 56. The first stage 54 selects a subset of unordered bits that are input in a relatively random order, where routing constraints are partially dependent on the redundancy factor of both stages from the PLD domain. The subset of possible input bits is passed from the first stage 54 to the second stage 56 where the bits are converted to form the output vectors of the second stage.

Thus, the second stage 56 produces the output vectors provided on output port 52. Each bit of the output vectors may be selected from a set of bits that includes power, ground, and/or any bits from the first stage.

A redundancy factor R determines how many paths are provided within the interface 26 for each input bit to the output of the first stage. A larger R factor minimizes routing constraints of signals in the PLD domain. A general flexibility factor F is provided where a larger value of F minimizes routing constraints in the PLD domain. That is, a high redundancy factor coupled with a high input/output bit ratio loosens constraints of placing and routing of signals in the PLD domain.

The input port 50 of the interface 26 is coupled to N wires in the PLD domain (N being the number of input bits accepted by the port). The output port of the is coupled to K×W wires in the vector domain (K being the number of vectors and W being the number of bits per vector). Greater routing flexibility in the PLD domain is achieved when N is larger than K times W. The interface 26 has two features that affect the flexibility of creating output words from input bits: the selection redundancy factor R and the output population density P. Some of the parameters of the circuit include the following:

the number of input bits (N), the number of output vectors (K), the number of bits per vector (W), the chances for each input bit to be selected as a possible output bit (R), the ratio of output connections to possible bit value (P) and the flexibility factor F=(R)(N)/(K)(W).

Figure 5:
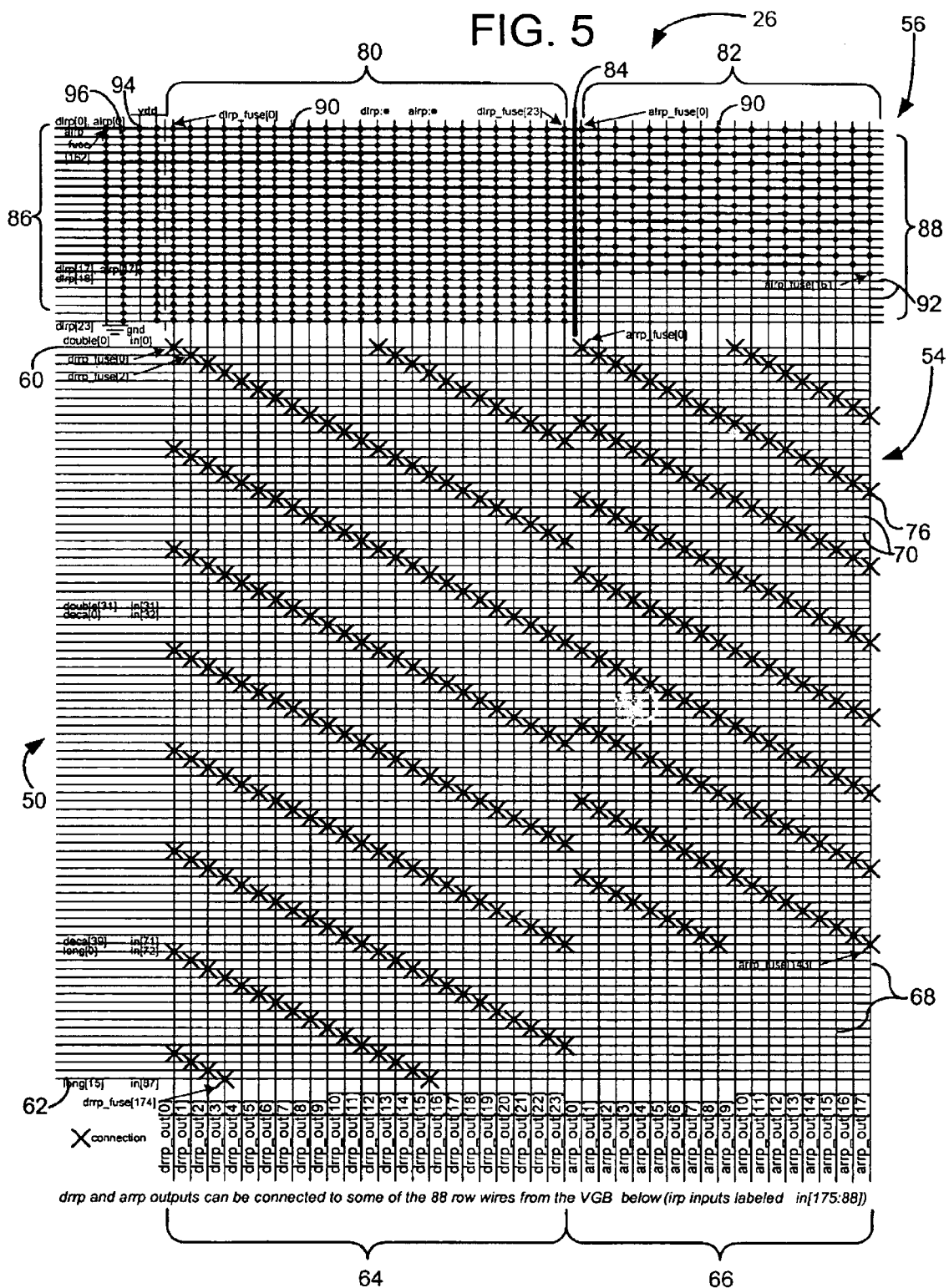
FIG. 5 is a detailed circuit diagram of an interface of FIG. 4.

FIG. 5 shows a detailed circuit diagram of an exemplary two-stage interface 26. The interface 26 includes the first stage, shown generally at 54, and the second stage, shown generally at 56. The input port 50 of the first stage 54 accepts PLD input bits including the first bit In[0] shown at 60 and the last input bit In[87] shown at 62. Although eighty-eight inputs are shown in this example, any desired number of inputs may be used. Although not shown, the input port may have a fuse associated with every input bit line so as to electrically isolate the VPB from the PLD as needed during configuration or normal operation. The first stage 54 also includes a data section 64 and an address section 66. The data section 64 accepts data bits 0–23 and labeled drrp_out [i]. The address section 66 accepts address bits 0–17, which are labeled arrp_out[i]. Of course, any number of bits may be used for either of the data or address sections. Each bit accepted by the data and address sections 64, 66 is associated with a line or conductor, such as line 68, and running vertically in an illustration of FIG. 5 (the lines being electrically in parallel). The vertical lines 68 intersect with horizontal input lines from the input port 50, such as line 70, (which are also electrically parallel) to create an array of interconnection points. A plurality of fuses, such as a fuse shown at 76, are placed at selected intersections between the horizontal and vertical lines 68, 70. The fuses 76 allow configurability so that an electrical connection can be formed at the junction between the vertical and horizontal lines. That is, if a fuse is activated it forms an electrical connection at the junction and if the fuse is not activated it does not form an electrical connection at the junction.

The vertical lines 68 couple the first stage 54 to the second stage 56. The second stage 56 also includes a data section 80 and an address section 82, which are separated by the logical break shown at 84. The data section 80 provides vector outputs shown generally at 86 while the address section 82 provides address vector outputs shown at 88. Both the data and address sections 80, 82 have fuses, such as at 90, for making connections between the vertical lines 68 and horizontal vector lines shown generally at 92. It should be noted that the data section has fuses 90 populated at every intersection between the vector lines 92 and the vertical input lines 68 (fully populated), while the address section 82 is only 50% populated with fuses (partially populated). Of course, any fuse layout scheme may be implemented based on the particular design. However, in order to perform the formatting functions of scaling and sign-extension, it is desirable to have a 100% population of fuses 90 in the second stage in order to optimally minimize routing requirements in the PLD. The fuses 90 are configurable by a user to establish connections between the vector lines 92 and the vertical input lines 68. It should be noted that the logical break 84 creates a physical disconnect of the vector lines 92 between the address and data sections 80, 82. The data section 80 of the second stage 56 includes formatting circuits such as a power line 94 and a ground line 96. Lines 94, 96 allow for establishing power or ground connections (i.e., constants) to the vector line 92 based on the programming of fuses at the intersections between the lines 92 and the power and ground lines 94, 96. Thus, as described further below, data scaling and sign extension may be performed with these formatting circuits without using PLD domain resources. The formatting circuits can, of course, be implemented in other ways in the interface 26. Although not shown, other conductors with fuses may extend into the second stage 56. For example, conductors from another VPB may extend into the second stage and be programmably coupled into the second stage using fuses. Consequently, vectors from other VPBs may be programmably selected and integrated into the vectors of the VPB.

FIG. 6 shows an example of scaling that may be accomplished using a formatting circuit (e.g., the ground line 96) of the second stage 56. Block 110 shows input data bits in the PLD domain 01011 that are received in the first stage. Of course, these bits are only an example as other bit combinations and numbers of bits may be used. These five bits are converted in the vector domain to a sixteen-bit vector as shown in block 112. As can be seen at block 114, the PLD domain data bits are embedded within the vector domain data, but three of the least significant bits and the remainder of the most significant bits are padded with zeros using the ground line 96 from the second stage. Thus, constants from the interface may be combined with PLD domain data to form the final vectors. The resulting scaling of the vector domain data effectively creates a multiplication of the PLD domain data to create or generate the desired vector domain data. Of course, other scaling may be done. For example, the PLD domain data may be scaled by any integer number (e.g., 1, 2, 3, 4, etc.).

FIG. 7 shows an example of sign extension performed by the second stage 56 on input data received from the PLD domain. The sign extension is accomplished by repeatedly replicating the sign-bit of the incoming data to form the most significant bits of the vector. In block 120, the PLD domain data is represented as 11001. Of course, this is only an example and any PLD domain data may be used. In block 122, the vector domain conversion of the PLD domain data is shown with a sign extension provides by a formatting circuit (e.g., the power line 94). The data of only five bits in the PLD domain is converted to a 16-bit vector, which represents an identical number to the PLD domain data. The output vector domain data shown in block 122 includes the PLD domain data as shown in block 124. Thus, bits from the incoming data may be repeatedly selected to create a vector (having more bits than the incoming data) in the vector domain.

If PLD domain data needs to be scaled to a different magnitude for use in the vector domain, the interface 26 can efficiently shift the input bits and fill the least significant bits with zeros. Thus, the ability to scale or perform sign extension in the interface frees up routing and logic resources from the PLD domain. Additionally, when the width of the input data from the PLD domain is smaller than the fixed-width of the vector domain, sign extension can be performed more efficiently in the interface 26 freeing up more costly, logic and writing resources of the PLD domain.

In the illustrated embodiment of interface 26, formatting functions, including shifting and sign-extension, may be performed in the second stage through appropriate selection of power or ground or repeated selection of an input bit, such as an MSB, for any of the output bits. For example, in order to shift input bits left by B bits, ground is selected for the lower B bits and the signal bits are selected for the upper bits. If the input word size is less than W−B, then the most significant bits (MSBs) of the output word can be selected from power, ground or any other input bit, such as the MSB. Because sign extension is typically desirable, especially for DSP functions, the MSBs may also be chosen from the MSB of the input signal. These formatting functions can be done at the same time with the same circuit. In the example depicted in Table 1 below, power and ground are denoted by '1' and '0'. The bits of the input word are denoted as i4, i3, i2, i1 and i0, where i4 is the MSB of the input word and i0 is the LSB of the input word; output bits are numbered similarly, where the MSB is o11 and the LSB is o0.

TABLE 2

Example 12-bit Output Words from 5-bit Input Word

| Desired Function | o11 | o10 | o9 | o8 | o7 | o6 | o5 | o4 | o3 | o2 | o1 | o0 |
|---|---|---|---|---|---|---|---|---|---|---|---|---|
| None; fill MSBs with 0s | 0 | 0 | 0 | 0 | 0 | 0 | 0 | i4 | i3 | i2 | i1 | i0 |
| Shift left 2; pad MSBs | 0 | 0 | 0 | 0 | 0 | i4 | i3 | i2 | i1 | i0 | 0 | 0 |
| Shift left 2; sign-extended | i4 | i4 | i4 | i4 | i4 | i4 | i3 | i2 | i1 | i0 | 0 | 0 |

TABLE 2-continued

Example 12-bit Output Words from 5-bit Input Word

| Desired Function | o11 | o10 | o9 | o8 | o7 | o6 | o5 | o4 | o3 | o2 | o1 | o0 |
|---|---|---|---|---|---|---|---|---|---|---|---|---|
| Sign-extended only | i4 | i4 | i4 | i4 | i4 | i4 | i4 | i4 | i3 | i2 | i1 | i0 |

The method of configuring the interface 26 to format the desired vectors is as follows. Given an input word of W bits, the user defines the transfer function from PLD to vector domain in a hardware description language using a conventional software development tool, where the function is constrained to be any combination of shift, sign-extension, and filling of MSBs or LSBs with 0s or 1s. The following code fragment illustrates the functions defined in the above example.

TABLE 2

Example Hardware Description Language for Functions of Table 1

| Desired Function | HDL Function |
|---|---|
| Just fill MSBs with 0s | o[11:0] = {GND} 7, i[4:0] |
| Shift left 2; pad MSBs | o[11:0] = {GND} 5, i[4:0], {GND}2 |
| Shift left 2; sign-extend | o[11:0] = {i[4]} 6, i[3:0], {GND}2 |
| Sign-extend only | o[11:0] = {i[4]} 8, i[3:0] |

FIG. 8 shows a flow chart of the steps the interface 26 performs in converting bits in the PLD domain to vectors in the vector domain. In the process block 130, bits in the PLD domain are received. For example, such bits may be received on the input port 50 (FIG. 4) in any order. In process block 132, the bits in the first stage 54 are selected via the appropriate fuse connections 76 in the first stage. In process block 134 the selected bits are converted by the second stage 56 via fuse connections 90 into one or more vectors of multiple bits arranged in a predetermined order. Of course, simultaneously any desired formatting of the vectors such as through sign extension or scaling may be performed.

Having illustrated and described the principles of the illustrated embodiments, it will be apparent to those skilled in the art that the embodiments can be modified in arrangement and detail without departing from such principles.

Although a specific two-stage interface is shown, the conversion from the PLD domain to the vector domain may be accomplished using other designs, as those skilled in the art will readily recognize.

Additionally, although a particular structure is shown for the PLD, a wide variety of PLD layouts may be used. The principles of the invention, of course, are also applicable to other PLDs such as complex PLDs (CPLDs).

In the above description, "data", such as in "PLD domain data" refers to data generically and may include data, address, control bits, etc.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

I claim:

1. A programmable logic device (PLD), comprising:
   multiple programmable logic blocks that perform operations on a bit-by-bit basis in a PLD domain, such that the bits are unordered;
   an engine operable to process data, the engine performing operations on data ordered in vectors; and
   an interface coupled between a programmable logic block and the engine, the interface operable to convert at least a portion of the unordered bits from the PLD domain to a vector and providing the vector to the engine, wherein the interface is operable to perform sign extension on the unordered bits in the conversion of the unordered bits to a vector.

2. A programmable logic device (PLD), comprising:
   multiple programmable logic blocks that perform operations on a bit-by-bit basis in a PLD domain, such that the bits are unordered;
   an engine operable to process data, the engine performing operations on data ordered in vectors; and
   an interface coupled between a programmable logic block and the engine, the interface operable to convert at least a portion of the unordered bits from the PLD domain to a vector and providing the vector to the engine, wherein the interface includes two stages, a first stage having multiple fuses configured to select unordered bits, which are used in part to create a fixed-width vector, and a second stage configured to perform the conversion of the selected unordered bits into the fixed-width vector.

3. The circuit of claim 2, wherein the second stage includes power and ground conductors having multiple fuses coupled thereto for selectively programming constants into the fixed-width vector and combining the constants with the selected unordered bits to create the fixed-width vector.

4. The circuit of claim 2, wherein the first stage includes an input port having a first set of conductors configured to carry signals associated with the unordered bits and a second set of conductors perpendicular to the first set of conductors forming potential interconnection points between the first and second set of conductors.

5. The circuit of claim 4, further including an array of fuses positioned at the potential interconnection points to allow selective programming of the first stage, each fuse being programmable to directly connect one of the first set of conductors to one of the second set of conductors.

6. A programmable logic device (PLD), comprising:
   multiple programmable logic blocks that perform operations on a bit-by-bit basis in a PLD domain, such that the bits are unordered;
   an engine operable to process data, the engine performing operations on data ordered in vectors; and
   an interface coupled between a programmable logic block and the engine, the interface operable to convert at least a portion of the unordered bits from the PLD domain to a vector and providing the vector to the engine, wherein the interface includes a first stage and a second stage and a set of parallel conductors extending from the first stage into the second stage, the second stage including multiple fuses coupled to the parallel conductors for selectively programming which signals on the parallel conductors are used by the second stage.

7. A programmable logic device (PLD), comprising:
   multiple programmable logic blocks that perform operations on a bit-by-bit basis in a PLD domain, such that the bits are unordered;
   an engine operable to process data, the engine performing operations on data ordered in vectors; and
   an interface coupled between a programmable logic block and the engine, the interface operable to convert at least a portion of the unordered bits from the PLD domain to a vector and providing the vector to the engine, wherein the interface allows for selecting a same unordered bit multiple times in forming a single vector.

8. An interface within a PLD, comprising:
an input port coupled to unordered bits in a PLD domain;
a first stage coupled to the input port, the first stage including a first array of programmable fuses and a first set of multiple parallel signal conductors, the fuses allowing programmable connection between selected unordered bits from the input port and selected ones of the multiple parallel signal conductors from the first set, and
a second stage coupled to the first stage and having a second array of programmable fuses and a second set of multiple parallel signal conductors, the second array of programmable fuses allowing programmable connection between selected ones of the first set of multiple parallel signal conductors and the second set of multiple parallel signal conductors to receive the unordered bits from the first set of multiple parallel conductors and convert the bits into fixed-width vectors to use in a vector processing block.

9. The circuit of claim 8, wherein the first stage has an address section and a data section.

10. The circuit of claim 8, wherein the second stage includes a third set of parallel conductors, and further including programmable fuses to selectively connect the third set of conductors to the second set of multiple parallel conductors.

11. The circuit of claim 8, wherein the unordered bits from the PLD domain are scaled using the second stage.

12. The circuit of claim 8, wherein at least a portion of the unordered bits from the PLD domain are scaled to a different magnitude in the second stage and converted into a fixed-width vector.

13. The circuit of claim 8, wherein at least a portion of the unordered bits from the PLD domain are sign-extended to a predetermined vector length in the second stage and converted into a fixed-width vector.

14. The circuit of claim 8, wherein conductors from the input port and the first set of multiple parallel signal conductors are perpendicular to each other with the fuses being positioned at selected points of intersection.

15. The circuit of claim 8, wherein an unordered bit may be selected multiple times in the second stage to form a single vector.

16. A method of converting unordered bits in a PLD domain to fixed-width vectors for use in a vector domain, comprising:
receiving the unordered bits from the PLD domain;
selecting which of the unordered bits to use in the vector domain; and
converting the unordered bits into fixed-width vectors to use in the Vector domain.

17. The method of claim 16, wherein converting includes scaling the unordered bits using constants.

18. The method of claim 16, wherein converting includes performing sign extension.

19. The method of claim 16, wherein converting includes programmably connecting power and ground to some of the bits in a fixed-width vector and combining the power and ground connections with some of the unordered bits to create the fixed-width vector.

20. A circuit for converting unordered bits in a PLD domain to fixed-width vectors for use in a vector domain, comprising:
means for receiving the unordered bits from the PLD domain;
means for selecting which of the unordered bits to use in the vector domain; and
means for converting the unordered bits into fixed-width vectors.

21. The circuit of claim 20, wherein the selecting means includes means for programmably connecting the received unordered bits to the converting means.

22. The circuit of claim 20, wherein the converting means includes means for scaling the unordered bits.

23. The circuit of claim 20, wherein the converting means includes means for extending the sign of the unordered bits.

24. A field programmable gate array (FPGA), comprising:
an FPGA domain including multiple programmable logic blocks that process data in the form of individual bits;
a vector domain including one or more engines that process data in the form of vectors that each include multiple bits; and
an interface coupled between the FPGA domain and the vector domain, the interface operable to convert individual bits received from the FPGA domain into a vector for processing in the vector domain, wherein the interface is configurable to select individual bits received from the FPGA domain and to arrange the selected bits into a predetermined order in the vector.

25. The FPGA of claim 24 wherein interface is configurable to format the selected bits into a vector having a fixed bit width.

26. The FPGA of claim 25 wherein the interface is configurable to shift the selected bits and/or extend the sign of the selected bits within a vector.

27. A field programmable gate array (FPGA), comprising:
an FPGA domain including multiple programmable logic blocks that process data in the form of individual bits;
a vector domain including one or more engines that process data in the form of vectors that each include multiple bits; and
an interface coupled between the FPGA domain and the vector domain, the interface operable to convert individual bits received from the FPGA domain into a vector for processing in the vector domain, wherein the interface comprises:
a first stage configurable to select individual bits from the FPGA domain; and
a second stage configurable to arrange the selected bits into a predetermined order in the vector.

28. The FPGA of claim 27 wherein the second stage is configurable to format the selected bits into a vector having a fixed bit width.

29. The FPGA of claim 28 wherein the second stage includes a first formatting circuit operable to shift the selected bits and/or a second formatting circuit operable to extend the sign of the selected bits.

30. The FPGA of claim 28 wherein the second stage is configurable to convert the selected bits into a data vector and/or an address vector.

31. The FPGA of claim 28 wherein the first stage comprises a partially populated switch matrix and the second stage comprises a fully populated switch matrix.

32. An interface within an FPGA comprising:
a first stage configurable to select individual bits from a set of bits produced by programmable logic blocks within the FPGA; and
a second stage configurable to arrange and format the selected bits into a vector having a fixed bit width, the second stage including a first formatting circuit operable to shift the selected bits and/or a second formatting circuit operable to extend the sign of the selected bits.

* * * * *